US010401081B2

United States Patent
Jorapur et al.

(10) Patent No.: US 10,401,081 B2
(45) Date of Patent: Sep. 3, 2019

(54) ADAPTER CROSSBAR FOR APPLIANCE USER INTERFACE

(71) Applicant: WHIRLPOOL CORPORATION, Benton Harbor, MI (US)

(72) Inventors: Pavan P. Jorapur, Pune (IN); Chad J. Rotter, Saugatuck, MI (US); Pradip Varpe, Pune (IN); Binil K. Jose, Auckland (NZ)

(73) Assignee: Whirlpool Corporation, Benton Harbor, MI (US)

( * ) Notice: Subject to any disclaimer, the term of this patent is extended or adjusted under 35 U.S.C. 154(b) by 84 days.

(21) Appl. No.: 15/782,928

(22) Filed: Oct. 13, 2017

(65) Prior Publication Data

US 2019/0113275 A1   Apr. 18, 2019

(51) Int. Cl.
| | |
|---|---|
| *H05K 7/02* | (2006.01) |
| *H05K 7/04* | (2006.01) |
| *F25D 29/00* | (2006.01) |
| *A47F 3/04* | (2006.01) |
| *H05K 5/00* | (2006.01) |
| *H05K 5/02* | (2006.01) |
| *F25D 23/06* | (2006.01) |

(52) U.S. Cl.
CPC .......... *F25D 29/005* (2013.01); *A47F 3/0434* (2013.01); *F25D 23/066* (2013.01); *H05K 5/0017* (2013.01); *H05K 5/0204* (2013.01); *F25D 2400/361* (2013.01)

(58) Field of Classification Search
USPC ........................................ 361/807, 809, 810
See application file for complete search history.

(56) References Cited

U.S. PATENT DOCUMENTS

| 4,623,179 A * | 11/1986 | Davis ..................... D06F 37/42 |
| | | 292/201 |
| 6,658,868 B2 | 12/2003 | Raab et al. |
| 7,256,991 B2 * | 8/2007 | Sullivan .................... G06F 1/16 |
| | | 361/679.48 |
| 7,573,701 B2 | 8/2009 | Doberstein et al. |
| | (Continued) | |

FOREIGN PATENT DOCUMENTS

| EP | 2532973 A1 * | 12/2012 | ............. E05C 19/06 |
| WO | 2016009382 A1 | 1/2016 | |

*Primary Examiner* — Hung S. Bui
(74) *Attorney, Agent, or Firm* — Price Heneveld LLP

(57) ABSTRACT

A refrigerated appliance includes a crossbar assembly disposed above a mounting area. The crossbar assembly includes a hooked portion that is operably coupled to a hook portion of a crossbar adapter. The crossbar adapter further includes a deflecting arm operable between at-rest and flexed positions. A housing includes an upper sidewall with a ramped introductory portion and a stepped snap feature. The deflecting arm of the crossbar adapter moves towards the flexed position from the at-rest position as the ramped introductory portion of the upper sidewall engages the deflecting arm of the crossbar adapter when the housing is received in the mounting area. The deflecting arm of the crossbar adapter resiliently snaps towards the at-rest position from the flexed position when the stepped snap feature of the housing clears a stepped snap feature disposed on the deflecting arm to releasably couple the housing to the crossbar adapter.

14 Claims, 8 Drawing Sheets

(56) References Cited

U.S. PATENT DOCUMENTS

| | | | |
|---|---|---|---|
| 7,715,201 B2 * | 5/2010 | Besserer | G09F 1/12 |
| | | | 361/752 |
| 7,726,057 B2 * | 6/2010 | Brinkman | G09F 3/204 |
| | | | 248/220.21 |
| 9,255,355 B2 | 2/2016 | Bas et al. | |
| 2014/0139088 A1 | 5/2014 | Seeley | |
| 2015/0313029 A1 | 10/2015 | Kim et al. | |
| 2017/0059237 A1 | 3/2017 | Anderson et al. | |
| 2017/0064843 A1 * | 3/2017 | Dernier | H05K 5/0021 |

\* cited by examiner

ADAPTER CROSSBAR FOR APPLIANCE USER INTERFACE

BACKGROUND

Refrigerated appliances often contain user interface modules that a user can engage to change various settings of the appliance. These modules will often include an electronic touch film that must be spaced-apart from metal crossbar assemblies to ensure that interference is diminished therebetween. Currently, mullion crossbar assemblies have to deflect under a load to accommodate a snap feature of a user interface housing in assembly. The force required to assemble the user interface housing between the mullion crossbar assemblies is significant. Access to current user interface modules is also an issue as access is only possible from the top of crossbars and behind the user interface assembly. This makes it difficult for service technicians to un-mount the user interface assembly and there is a high probability of mullion crossbars getting deformed due to repetitive mounting and disassembling of the user interface housing that can damage snap features between the user interface and the mullion crossbars.

BRIEF SUMMARY OF THE DISCLOSURE

According to one aspect of the disclosure, a refrigerated appliance includes upper and lower crossbar assemblies that are spaced-apart from one another to define a mounting area therebetween. A crossbar adapter having a hooked portion is operably coupled to a reciprocal hooked portion of the upper crossbar assembly, wherein the crossbar adapter further includes a deflecting arm having a ramped proximal portion and an outwardly offset distal tab with a stepped snap feature disposed therebetween. The deflecting arm is operable between at-rest and outwardly flexed positions. A user interface module includes a housing with upper and lower sidewalls, wherein each of the upper and lower sidewalls of the housing includes an outwardly extending barb. The outwardly extending barb of the upper sidewall engages the ramped proximal portion of the deflecting arm of the crossbar adapter to flex the deflecting arm of the crossbar adapter as the user interface module is received in the mounting area. The deflecting arm of the crossbar adapter is configured to resiliently snap towards the at-rest position when the outwardly extending barb of the upper sidewall of the housing clears the stepped snap feature of the deflecting arm to releasably couple the housing to the crossbar adapter.

According to another aspect of the present disclosure, a refrigerated appliance includes a mounting area and a crossbar assembly disposed above the mounting area, wherein the crossbar assembly includes a hooked portion. A crossbar adapter includes a hooked portion operably coupled to the hooked portion of the crossbar assembly. The crossbar adapter further includes a downwardly extending deflecting arm operable between at-rest and flexed positions. A housing includes an upper sidewall with a ramped introductory portion and a stepped snap feature disposed thereon. The deflecting arm of the crossbar adapter moves towards the flexed position as the ramped introductory portion of the upper sidewall of the housing engages the deflecting arm of the crossbar adapter as the housing is received in the mounting area. The deflecting arm of the crossbar adapter resiliently snaps towards the at-rest position when the stepped snap feature of the housing clears a stepped snap feature disposed on the deflecting arm of the crossbar adapter to releasably couple the housing to the crossbar adapter.

According to yet another aspect of the present disclosure, an adapter member includes a hooked portion having a curved distal end defining a receiving area. A first arm outwardly extends from the curved distal end of the hooked portion and includes a snap feature disposed on a distal end thereof. A flexibly resilient second arm outwardly extends from the curved distal end of the hooked portion and is spaced-apart from the first arm. The second arm includes a ramped portion and a stepped snap feature disposed thereon. The second arm is operable between at-rest and flexed positions.

These and other features, advantages, and objects of the present disclosure will be further understood and appreciated by those skilled in the art by reference to the following specification, claims, and appended drawings.

BRIEF DESCRIPTION OF THE DRAWINGS

The foregoing summary, as well as the following detailed description of the disclosure, will be better understood when read in conjunction with the appended drawings. For the purpose of illustrating the disclosure, certain examples are shown in the drawings. It should be understood, however, that the disclosure is not limited to the precise arrangements and instrumentalities shown. Drawings are not necessarily to scale. Certain features of the disclosure may be exaggerated in scale or shown in schematic form in the interest of clarity and conciseness.

DETAILED DESCRIPTION

As required, detailed examples of the present disclosure are disclosed herein. However, it is to be understood that the disclosed examples are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

It is to be understood that the present disclosure is not limited to the particular examples described below, as variations of the particular examples may be made and still fall within the scope of the appended claims. It is also to be understood that the terminology employed is for the purpose of describing particular examples, and is not intended to be limiting. Instead, the scope of the present disclosure will be established by the appended claims.

Figure 1:
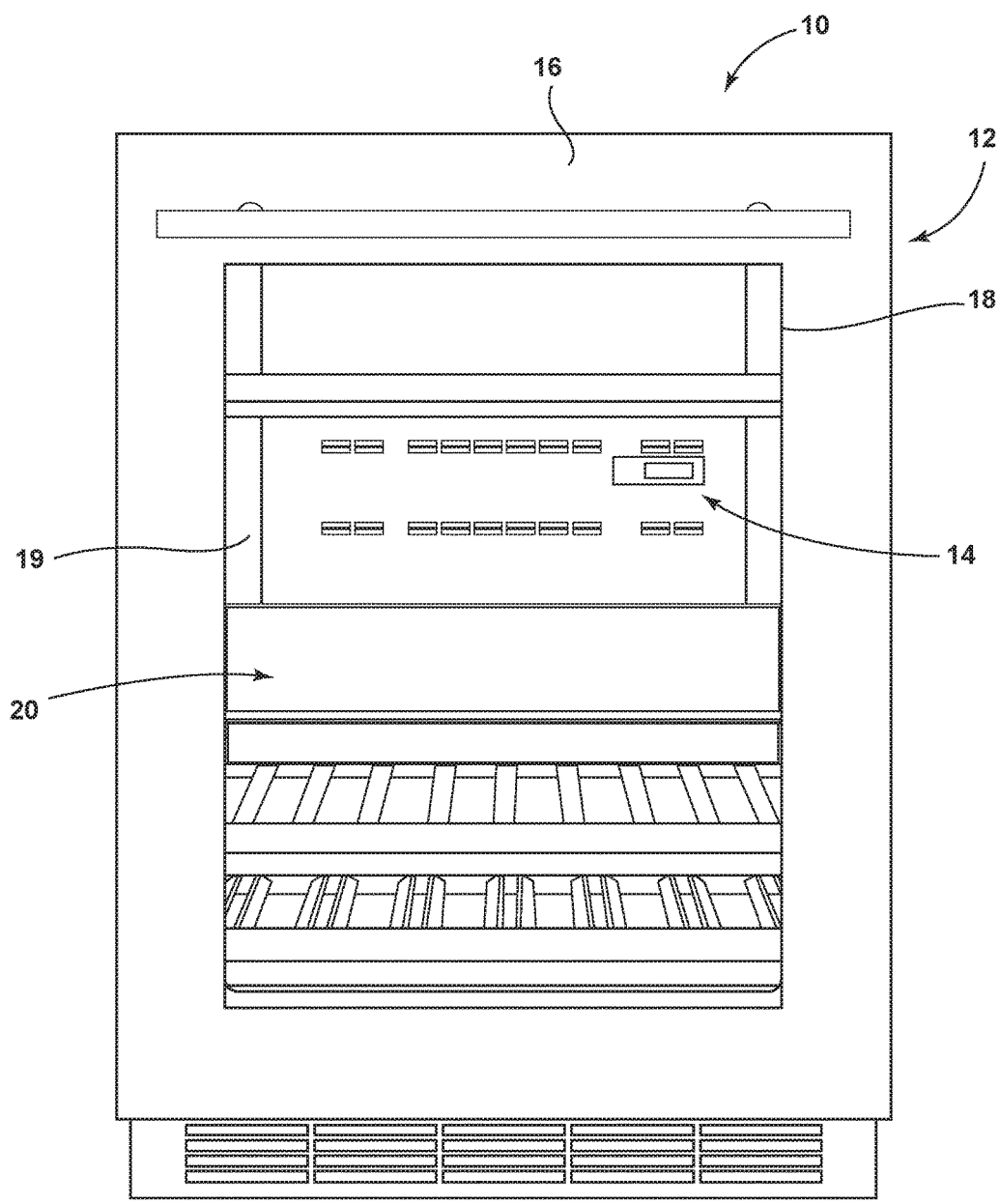
FIG. 1 is a front elevational view of a refrigerated appliance having a user interface disposed within a storage compartment thereof.

For purposes of description herein, the terms "upper," "lower," "right," "left," "rear," "front," "vertical," "horizontal," and derivatives thereof shall relate to the disclosure as oriented in FIG. 1, unless stated otherwise. However, it is to be understood that the disclosure may assume various alternative orientations, except where expressly specified to the contrary. It is also to be understood that the specific devices and processes illustrated in the attached drawings, and described in the following specification, are simply exemplary examples of the inventive concepts defined in the appended claims. Hence, specific dimensions and other physical characteristics relating to the examples disclosed herein are not to be considered as limiting, unless the claims expressly state otherwise.

Referring now to FIG. 1, a refrigerated appliance 10 is shown having a cabinet 12 defining a storage compartment 14. A door 16 is coupled to the cabinet 12 and configured to pivot between open and closed positions to selectively provide access to the storage compartment 14. The door 16 includes a centrally disposed glass panel 18 that allows for viewing of the storage compartment 14 when the door 16 is in the closed position shown in FIG. 1. A liner 19 generally defined the parameters of the storage compartment 14. A user interface module 20 is positioned at a mid-level portion of the storage compartment 14. The refrigerated appliance 10 shown in FIG. 1 is a compact refrigerator, however, the user interface module 20 and the support structures thereof are contemplated for use in any type of refrigerated appliance.

Figure 2:
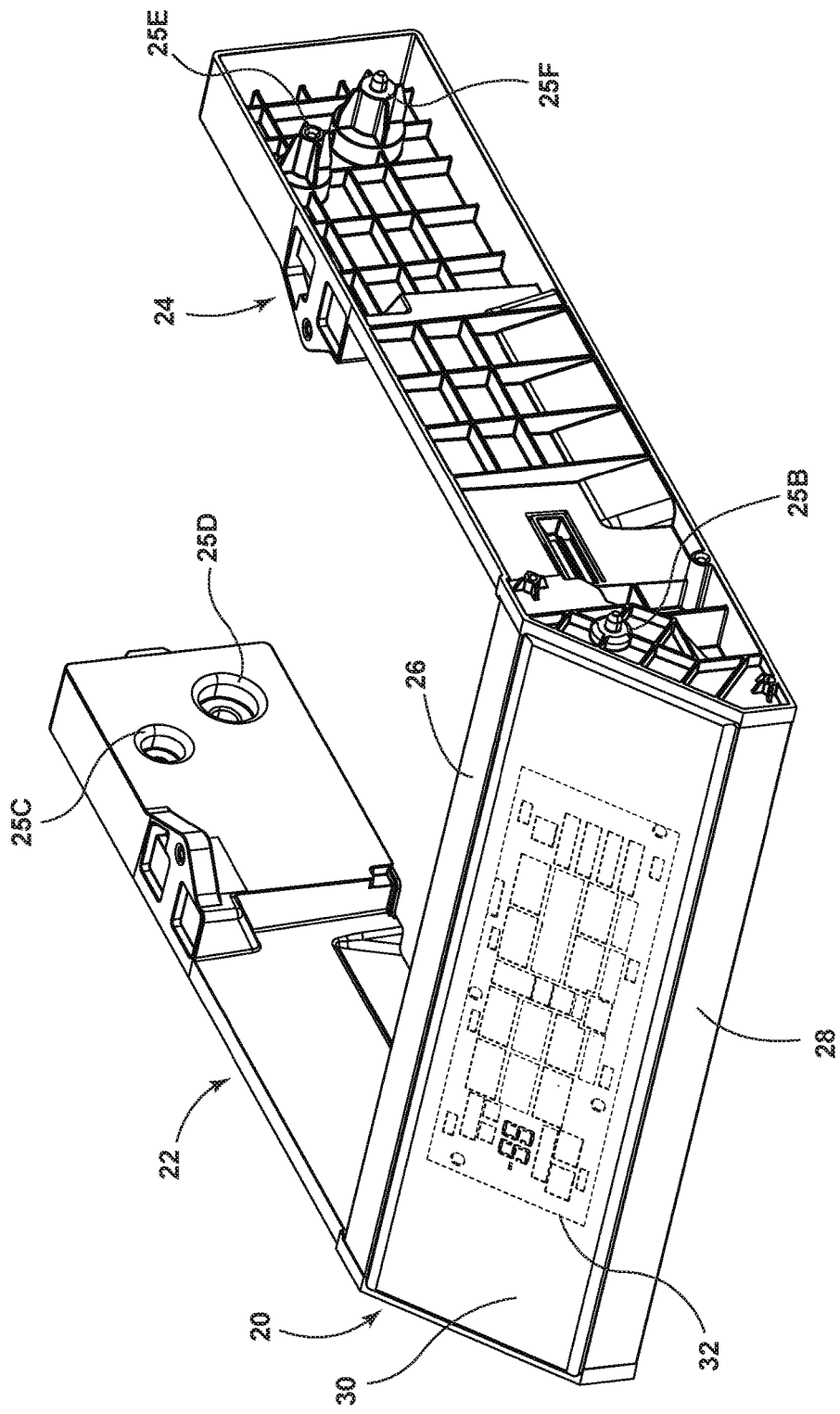
FIG. 2 is a top perspective view of the user interface of FIG. 1 and support structures therefor.

Referring now to FIG. 2, the user interface module 20 is shown with various support components thereof. Specifically, first and second support brackets 22, 24 are shown spaced-apart from one another and interconnected by upper and lower crossbar assemblies 26, 28. The first and second support brackets 22, 24 are contemplated to be injection molded polymeric part having a number of engagement features disposed thereon for coupling to the liner 19 of the refrigerated appliance 10, as well as for engaging the upper and lower crossbar assemblies 26, 28. The upper and lower crossbar assemblies 26, 28 are contemplated to be metal components comprised of a metal material which rigidly provide a mounting location for the user interface module 20. The upper and lower crossbar assemblies 26, 28 are coupled to the first and second support brackets 22, 24 via engagement features of the first and second support brackets 22, 24 and fasteners, as further described below. As further shown in FIG. 2, the user interface module 20 includes an electronic touchscreen 30 having an electronic touch film 32. In order to avoid interference between the metal crossbar assemblies 26, 28 and the electronic touch film 32, a spacing between the components is required. In use, the electronic touchscreen 30 in touch film 32 are configured to be engaged by a user to electronically control various settings of the refrigerated appliance 10 (FIG. 1). A plurality of mounting bosses 25B-25F are shown disposed on the first and second support brackets 22, 24 and are used to securely mount the first and second support brackets 22, 24 to the liner 19 of the refrigerated appliance 10 in assembly.

Figure 3:
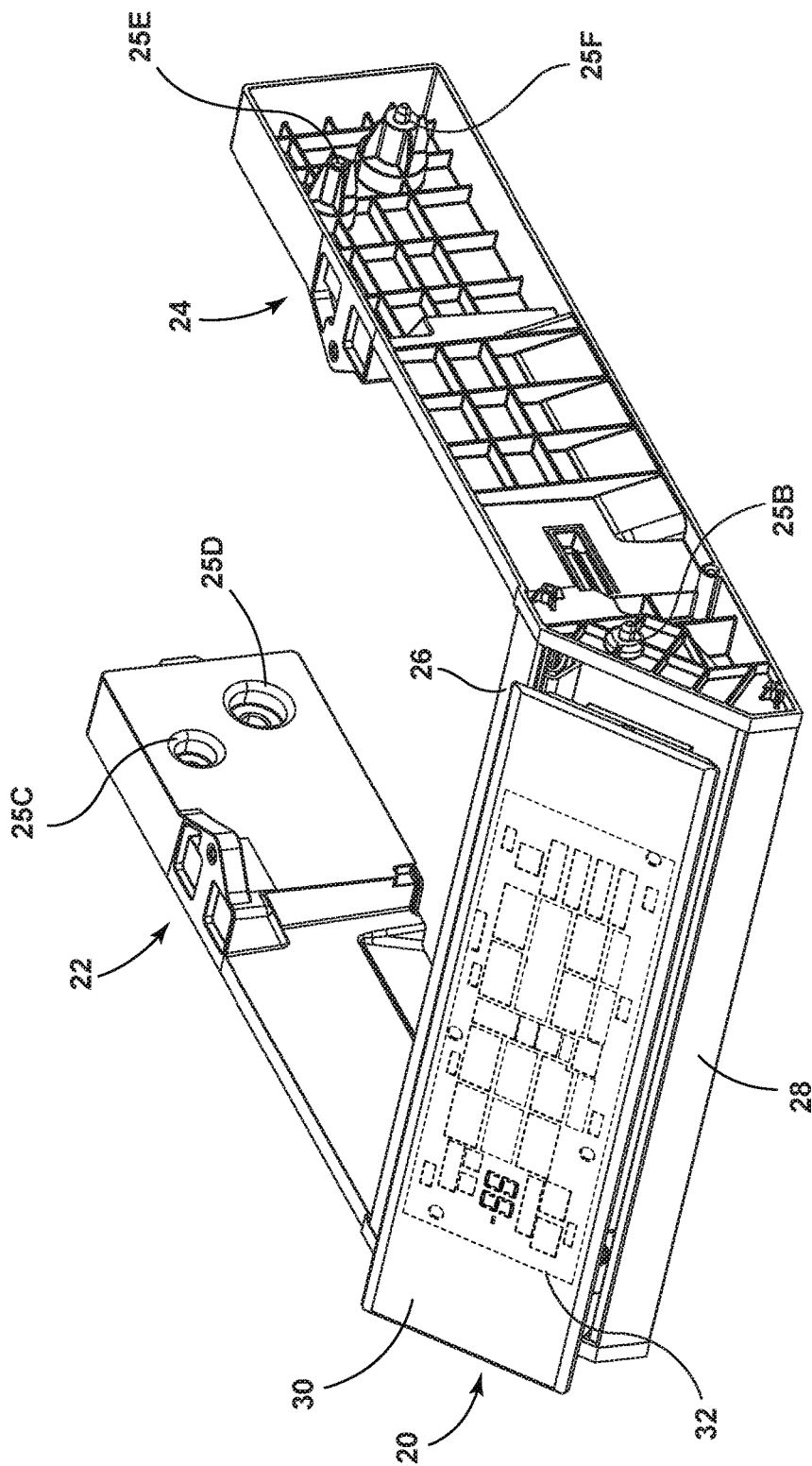
FIG. 3 is a top perspective view of the user interface of FIG. 2 being removed from the support structures therefor.
Figure 4:
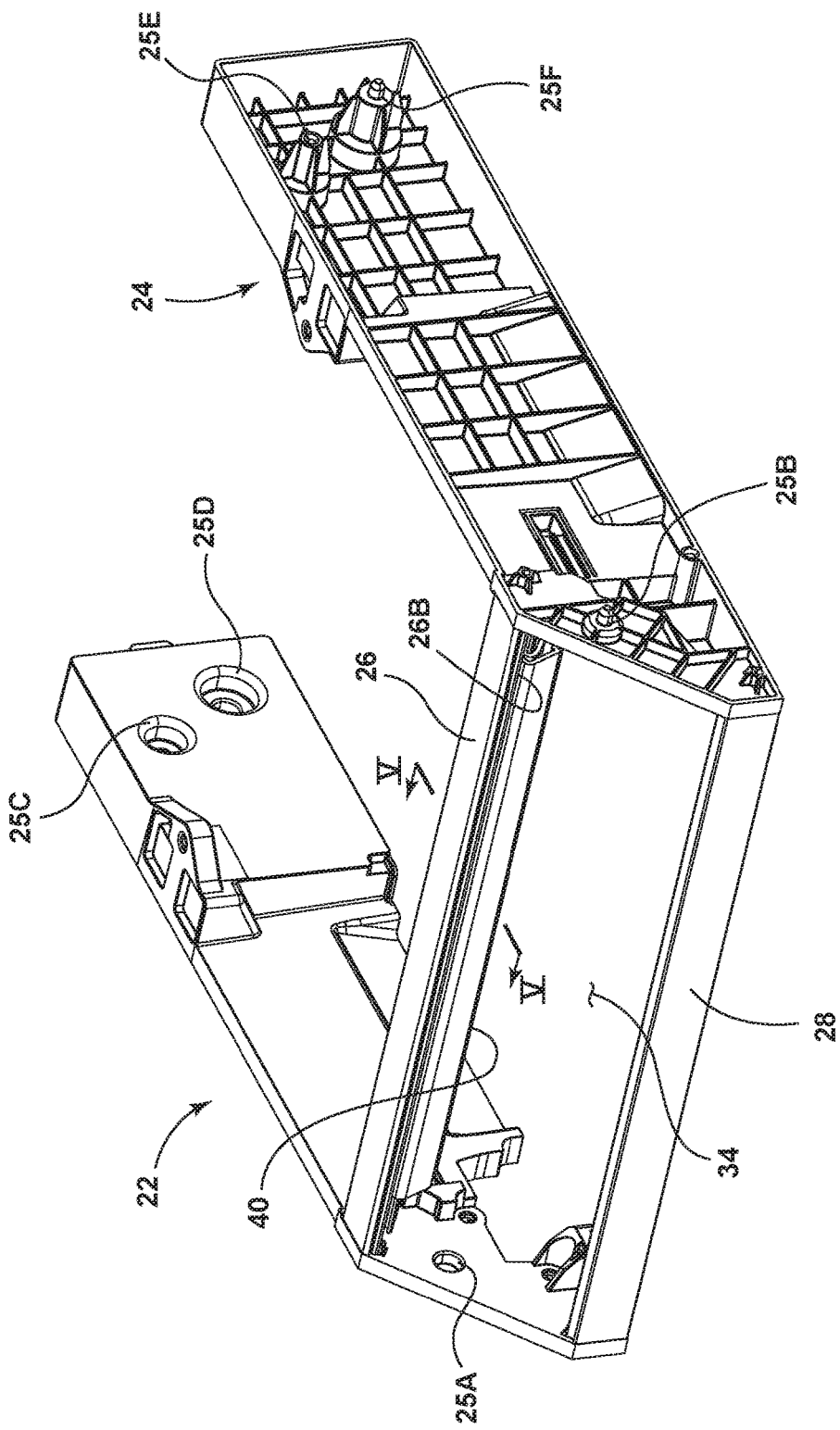
FIG. 4 is top perspective view of the support structures of FIG. 3 with the user interface removed therefrom.

Referring now to FIG. 3, the user interface module 20 is shown released from the upper and lower crossbar assemblies 26, 28 to which the user interface module 20 is releasably engaged. With reference to FIG. 4, the user interface module 20 is fully removed from the upper and lower crossbar assemblies 26, 28 to reveal a mounting area 34 disposed therebetween. In assembly, the user interface module 20 is mounted in the mounting area 34 disposed between the upper and lower crossbar assemblies 26, 28 as shown in FIG. 2. With the user interface module 20 removed from the mounting area 34, another mounting boss 25A of the first support bracket 22 is revealed. Further, with the user interface module 20 removed from the mounting area 34, a crossbar adapter 40 is shown coupled to an underside 26B of the upper crossbar assembly 26. In use, the crossbar adapter 40 is configured to releasably engage a housing of the user interface module 20 to secure the user interface module 20 in the mounting area 34. The crossbar adapter 40 is an adapter member that is contemplated to be comprised of a polymeric material, such as polyvinyl chloride (for example), having a number of molded-in engagement features, as further described below. As further shown in FIG. 3, the polymeric crossbar adapter 40 substantially spans a length of the upper crossbar assembly 26 to provide a wide coupling surface for the user interface module 20 and to shield the user interface module 20 from the metal parts of the upper crossbar assembly 26. Thus, as shown in FIG. 4, the crossbar adapter 40 is an elongate member having a length that is substantially commensurate with the length of the upper crossbar assembly 26.

Figure 5:
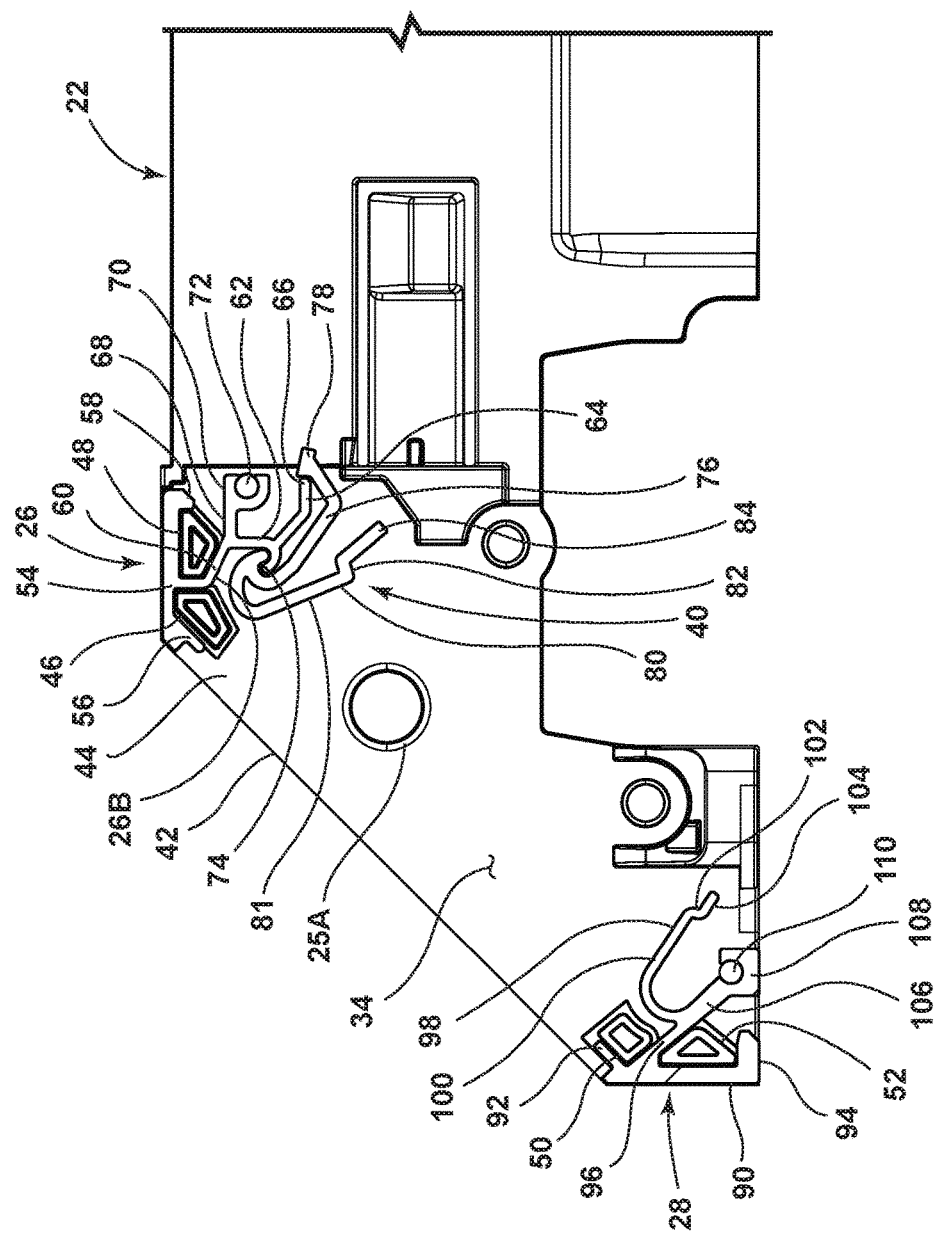
FIG. 5 is a cross-sectional view of the support structure of FIG. 4 taken at line V.

Referring now to FIG. 5, the cross-sectional view shows the spaced-apart upper and lower crossbar assemblies 26, 28 coupled to the first support bracket 22. While only the first support bracket 22 is shown in FIG. 5, it is contemplated that the interaction of the upper and lower crossbar assemblies 26, 28 with the first support bracket 22 is similar to the interaction of the upper and lower crossbar assemblies 26, 28 with the second support bracket 24, such that the description of the features of the first support bracket 22 provided herein are contemplated to describe the features of the second support bracket 24 as well. A front portion 42 of the first support bracket 22 includes an inner surface 44 having inwardly extending engagement features 46, 48, 50 and 52. As shown in FIG. 5, inwardly extending engagement features 46, 48 are coupled to, or otherwise engaged with, the upper crossbar assembly 26. Specifically, the upper crossbar assembly 26 includes a top wall 54 having first and second tabs 56, 58 disposed on opposite sides thereof which closely engage the geometric configurations of the inwardly extending engagement features 46, 48 of the first support bracket 22. An outwardly extending arm 60 extends downwardly from the top wall 54 between the inwardly extending engagement features 46, 48 of the first support bracket 22. The outwardly extending arm 60 branches into a hooked portion 62 having an outwardly extending tab 64 with a distal end 66. The outwardly extending arm 60 further branches into a fastening arm 68 having a mounting boss 70 which is configured to receive a fastener 72 to rigidly coupled the upper crossbar assembly 26 to the first support bracket 22.

As further shown in FIG. 5, the crossbar adapter 40 includes a hooked portion 74 which hooks to the hooked portion 62 of the upper crossbar assembly 26. In assembly, once the hooked portion 74 of the crossbar adapter 40 and the reciprocal hooked portion 62 of the upper crossbar assembly 26 are engaged with one another, the crossbar adapter 40 can be upwardly rotated, such that a snap feature 78 of a swivel arm 76 can releasably engage the distal end 66 of the outwardly extending tab 64 of the upper crossbar assembly 26 in a snap-fit engagement. As used herein, the term "snap feature" is used to describe a component part of a member having a geometric configuration configured for snap-fit engagement of a reciprocal feature, as known in the art. In this case, the snap feature 78 defines a distal end of swivel arm 76 and releasably engages the distal end 66 of the outwardly extending tab 64 of the upper crossbar assembly 26 in a snap-fit engagement to secure the crossbar adapter 40 to the underside 26B of the upper crossbar 26. As shown in FIG. 5, the swivel arm 76 outwardly extends from the hooked portion 74 of the crossbar adapter 40. A deflecting arm 80 also outwardly extends from the hooked portion 74 of the crossbar adapter 40. The deflecting arm 80 is contemplated to be a flexibly resilient member of the crossbar adapter 40 that is operable between at-rest and outwardly flexed positions. Further, the swivel arm 76 is contemplated to be a flexibly resilient member of the crossbar adapter 40 that is operable between at-rest and flexed positions for coupling to the distal end 66 of the outwardly extending tab 64 of the upper crossbar assembly 26. As shown in FIG. 5, the deflecting arm 80 is shown in the at-rest position and includes a ramped proximal portion 81 and an outwardly offset distal tab 84 with a stepped snap feature 82 disposed therebetween. In assembly, the stepped snap feature 82 is configured to engage a housing of the user interface module 20, as further described below. The specific features of the crossbar adapter 40 are also described below with reference to FIG. 8.

With further reference to FIG. 5, inwardly extending engagement features 50, 52 of the first support bracket 22 are coupled to, or otherwise engaged with, the lower crossbar assembly 28. Specifically, the lower crossbar assembly 26 includes a front wall 90 having first and second tabs 92, 94 disposed on opposite sides thereof which closely engage the geometric configurations of the inwardly extending engagement features 50, 52 of the first support bracket 22. An outwardly extending arm 96 extends outwardly from the front wall 90 between the inwardly extending engagement features 50, 52 of the first support bracket 22. The outwardly extending arm 96 branches into a deflecting arm 98 having a ramped proximal portion 100 and an outwardly offset distal tab 104 with a stepped snap feature 102 disposed therebetween. The deflecting arm 98 is operable between at-rest and outwardly flexed positions, and is shown in FIG. 5 in the at-rest position. In assembly, the stepped snap feature 102 is configured to engage a housing of the user interface module 20, as further described below. The outwardly extending arm 96 further branches into a fastening arm 106 having a mounting boss 108 which is configured to receive a fastener 110 to rigidly coupled the lower crossbar assembly 28 to the first support bracket 22.

Figure 6:
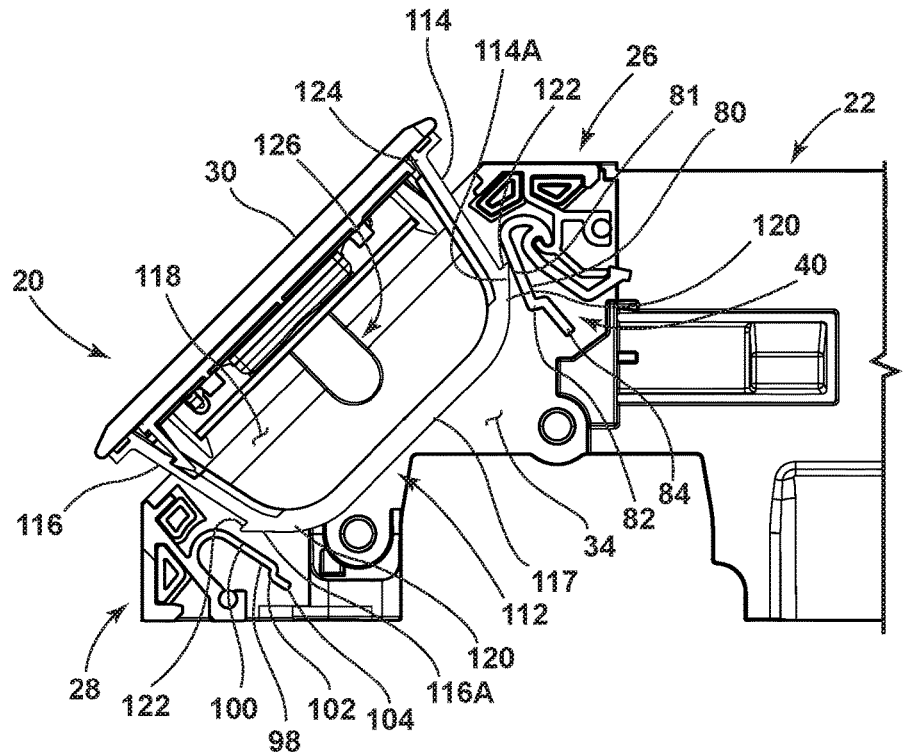
FIG. 6 is a cross-sectional view of the support structure and user interface of FIG. of FIG. 3 taken at line VI.

Referring now to FIG. 6, the user interface module 20 is shown being inserted into the mounting area 34 defined between the upper and lower crossbar assemblies 26, 28. The user interface module 20 includes a housing 112 having upper and lower sidewalls 114, 116 with outwardly extending barbs 114A, 116A, respectively. Each of the outwardly extending barbs 114A, 116A includes a ramped introductory portion 120 and a stepped snap feature 122. The housing 112 further includes a rear wall 117 which interconnects the upper and lower sidewalls 114, 116 to define an inner cavity 118. The housing 112 further includes an open front portion 124 to which the user interface module 20 couples to close off the inner cavity 118. Various electrical components 126 of the user interface module 20 are disposed within the inner cavity 118 of the housing 112 in assembly. As shown in FIG. 6, the electronic touchscreen 30 of the user interface module 20 abuts the open front portion 124 of the housing 112 to provide a clean aesthetic finish to the user interface module 20. In this way, the housing 112 is concealed within the mounting area 34 defined between the upper and lower crossbar assemblies 26, 28 when the user interface module 20 is coupled thereto.

With further reference to FIG. 6, the ramped introductory portions 120 of the upper and lower sidewalls 114, 116 are shown engaging the ramped proximal portions 81 and 100 of the deflecting arms 80, 98 of the crossbar adapter 40 and the lower crossbar assembly 28, respectively. Thus, as the ramped introductory portions 120 of the upper and lower sidewalls 114, 116 of the housing 112 engage the deflecting arms 80, 98, the deflecting arms 80, 98 of the crossbar adapter 40 and the lower crossbar assembly 28, respectively, outwardly flex towards the outwardly flexed positions thereof given their flexibly resilient nature. The deflecting arms 80, 98 of the crossbar adapter 40 and the lower crossbar assembly 28, respectively, continue to outwardly flex until the stepped snap features 122 of the upper and lower sidewalls 114, 116 of the housing 112 clear the stepped snap features 82, 102 of the crossbar adapter 40 and the lower crossbar assembly 28, respectively. As used herein, the term "outwardly flex" refers to the movement of the deflecting arms 80, 98 away from the mounting area 34. Thus, while deflecting arm 80 flexes towards the swivel arm 76, this movement is referred to herein as an outwardly flexing movement, unless otherwise stated or claimed. Similarly, while deflecting arm 98 flexes towards the fastening arm 106, this movement is referred to herein as an outwardly flexing movement, unless otherwise stated or claimed. Once the stepped snap features 122 of the upper and lower sidewalls 114, 116 of the housing 112 clear the stepped snap features 82, 102 of the crossbar adapter 40 and the lower crossbar assembly 28, respectively, the deflecting arms 80, 98 snap inwardly towards the at-rest positions given the flexibly resilient nature of the deflecting arms 80, 98. In this way, the housing 112 is releasably engaged with the crossbar adapter 40 and the lower crossbar assembly 28 as shown in FIG. 7.

Figure 8:
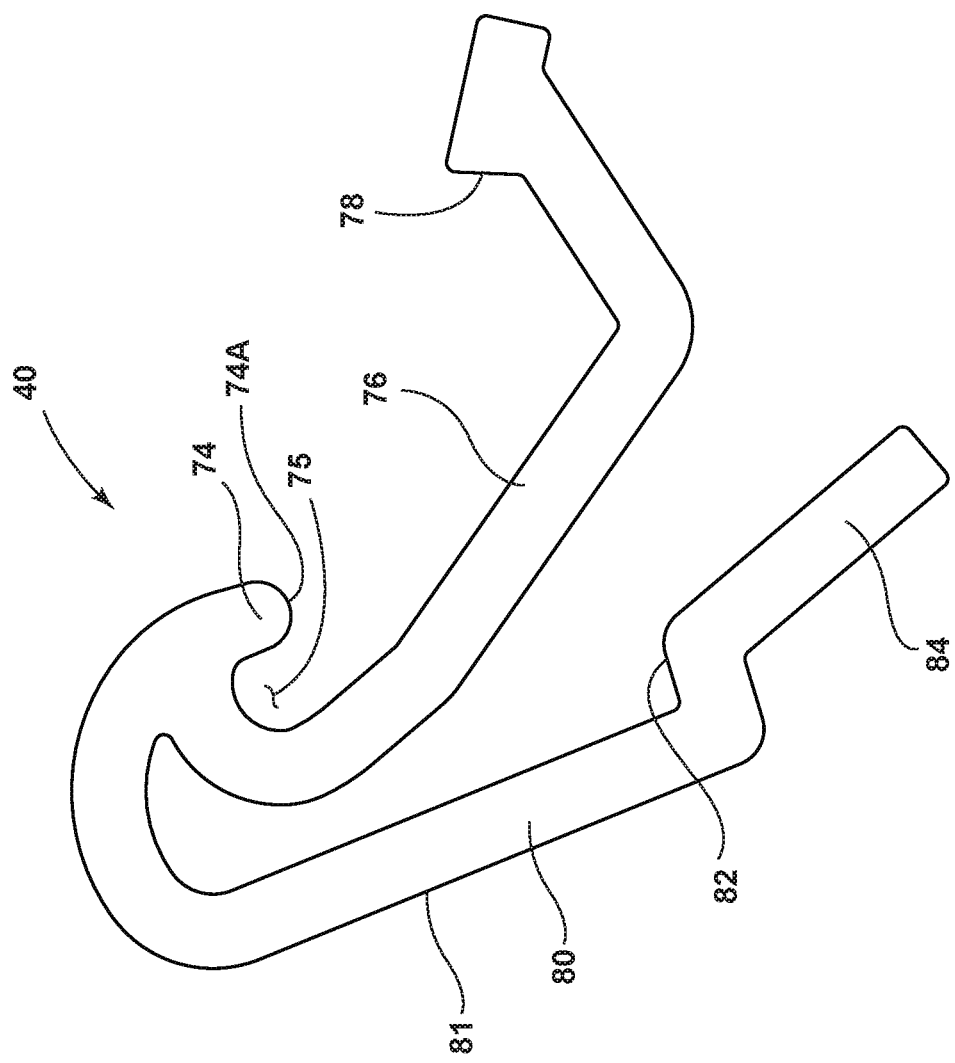
FIG. 8 is a cross-sectional view of an adaptive crossbar assembly of the support structure.
Figure 9:
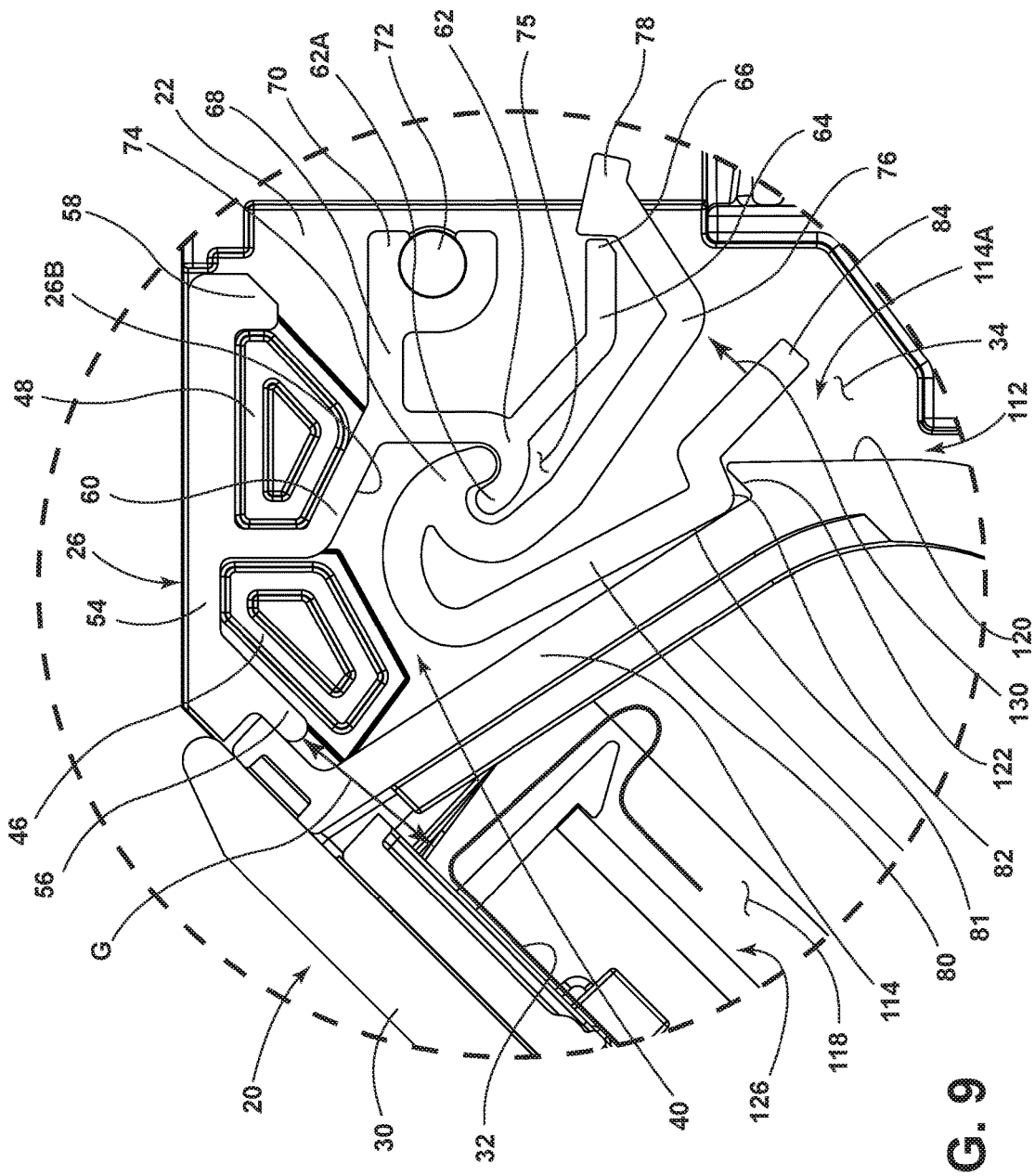
FIG. 9 is an enhanced view of the interaction of components of FIG. 7 taken at location IX.

Referring now to FIG. 8, the crossbar adapter 40 is shown with the hooked portion 74 having a curved distal end 74A defining a receiving area 75 which receives a distal end 62A (FIG. 9) of the hooked portion 62 of the upper crossbar assembly 26. The snap feature 78 of the swivel arm 76 engages the distal end 66 of the upper crossbar assembly 26 in a snap-fit engagement to secure the crossbar adapter 40 to the underside 26B of the upper crossbar assembly 26, as shown in FIG. 9. As further shown in FIGS. 8 and 9, the swivel arm 76 of the crossbar adapter 40 outwardly extends from the hooked portion 74 along with the deflecting arm 80. As shown in FIG. 9, the deflecting arm 80 is a flexibly resilient feature of the crossbar adapter 40, wherein the stepped snap feature 82 thereof engages the stepped snap feature 122 of upper sidewall 114 of barb 114A of the housing 112 of the user interface module 20. The stepped snap feature 82 defines a jog in the deflecting arm 80 between the ramped proximal portion 81 and the distal tab 84 of the deflecting arm 80. The jog portion makes for the stepped snap feature 82 that off sets the distal tab 84 from the ramped proximal portion 81. It will be appreciated by one of ordinary skill in the art that the above-described features of crossbar adapter 40 are contemplated to run the length of the crossbar adapter 40 given that the elongate configuration of the crossbar adapter 40.

To release the user interface module 20 from the crossbar adapter 40, the outwardly offset distal tab 84 of the crossbar adapter 40 defines a release tab that is accessible from a backside of the user interface module 20. The outwardly offset distal tab 84 of the crossbar adapter 40 can be pushed outwardly in a direction as indicated by arrow 130 towards the swivel arm 76 to release the snap-fit engagement between the stepped snap features 82, 122 of the crossbar adapter 40 and the upper sidewall 114 of the housing 112, respectively. Similarly, and with reference to FIG. 7, the outwardly offset distal tab 104 of the lower crossbar assembly 28 can be pushed outwardly in a direction as indicated by arrow 132 to release the snap-fit engagement between the stepped snap features 102, 122 of the lower crossbar assembly 28 and the lower sidewall 116 of the housing 112, respectively. In this way, the outwardly offset distal tabs 84, 104 of the crossbar adapter 40 and the lower crossbar assembly 28, respectively, defined release tabs for releasing the user interface module 20 from its releasably engaged position shown in FIG. 7. In this way, the user interface module 20 can be easily accessed and removed for servicing or replacement. Further, the snap feature 78 of the swivel arm 76 can be moved inwardly towards the deflecting arm 80 in a flexed position as the crossbar adapter 40 is rotated into engagement with the distal end 66 of the upper crossbar assembly 26. After clearing an outermost portion of the distal end 66 of the outwardly extending tab 64 of the upper crossbar assembly 26, the swivel arm 76 of the crossbar adapter 40 will move outwardly towards the at-rest position shown in FIG. 7 to engage the distal end 66 of the outwardly extending tab 64 of the upper crossbar assembly 26. Once coupled to the upper crossbar assembly 26, the swivel arm 76 of the crossbar adapter 40 can be moved downward towards a flexed release position to release the swivel arm 76 from the crossbar adapter 40.

Figure 7:
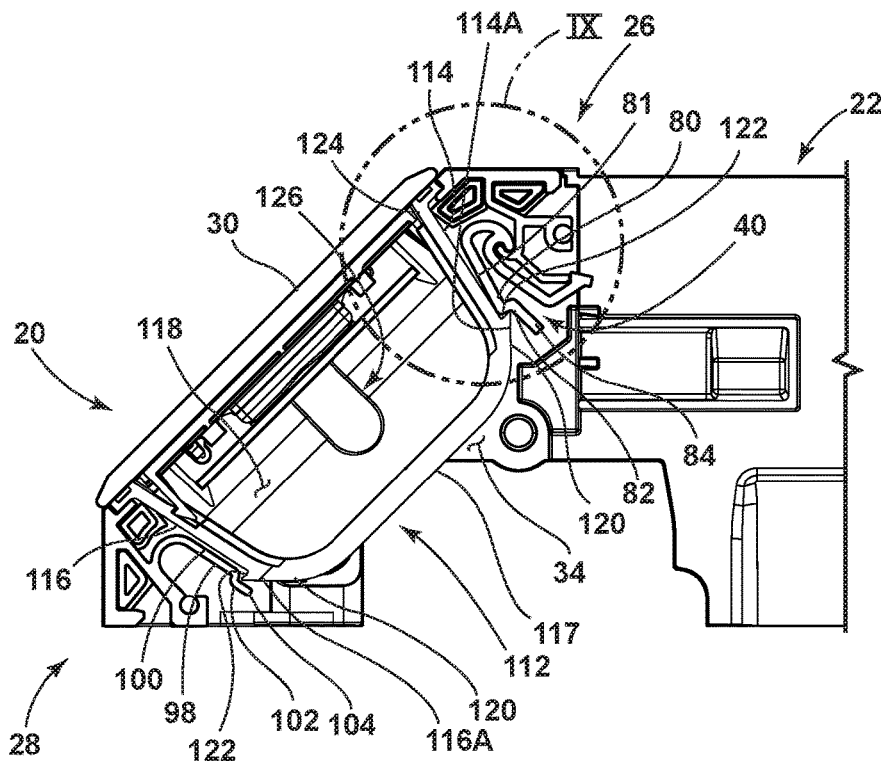
FIG. 7 is a cross-sectional view of the support structure and user interface of FIG. of FIG. 2 taken at line VII.

With further reference to FIG. 7, it is contemplated that the deflecting arms 80, 98 of the crossbar adapter 40 and the lower crossbar assembly 28, respectively, are slightly in the outwardly flexed positions relative to the mounting area 34, such that the deflecting arms 80, 98 of the crossbar adapter 40 and the lower crossbar assembly 28, respectively, apply inward pressure on the upper and lower sidewalls 114, 116 of the housing 112 to provide a robust engagement therebetween.

With further reference to FIG. 9, and as noted above, a gap must exist between the electronic touch film 32 and the metal upper and lower crossbar assemblies 26, 28. In FIG. 9, a gap G is shown disposed between the upper crossbar assembly 26 and the electronic touch film 32 disposed within the inner cavity 118 of the housing 112. The gap G is defined between the nearest portion of the upper crossbar assembly 26 and the nearest portion of the electronic touch film 32. The gap G is configured to provide adequate spacing or clearance to avoid interference between the electronic touch film 32 and the metal upper crossbar assembly 26. A similar spacing is also contemplated between the electronic touch film 32 and the metal lower crossbar assembly 28 when the user interface module 20 is received in the mounting area 34 disposed between the upper and lower crossbar assemblies 26, 28. It is contemplated that the gap G is provides a spacing between the electronic touch film 32 and the upper and lower crossbar assemblies 26, 28, wherein the spacing spans a distance within a range of about 5 mm to about 8 mm.

It will be understood by one having ordinary skill in the art that construction of the described invention and other components is not limited to any specific material. Other exemplary examples of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

Furthermore, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably couplable" to each other to achieve the desired functionality. Some examples of operably couplable include, but are not limited to, physically mateable and/or physically interacting components and/or wirelessly interactable and/or wirelessly interacting components and/or logically interacting and/or logically interactable components.

It is also important to note that the construction and arrangement of the elements of the invention as shown in the exemplary examples is illustrative only. Although only a few examples of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system might be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary examples without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A refrigerated appliance, comprising:
   upper and lower crossbar assemblies spaced-apart from one another to define a mounting area therebetween;
   a crossbar adapter having a hooked portion operably coupled to a reciprocal hooked portion of the upper crossbar assembly, wherein the crossbar adapter further includes a deflecting arm having a ramped proximal portion and an outwardly offset distal tab with a stepped snap feature disposed therebetween, the deflecting arm being operable between at-rest and flexed positions; and
   a user interface module having a housing with upper and lower sidewalls, wherein each of the upper and lower sidewalls of the housing includes an outwardly extending barb, wherein the outwardly extending barb of the upper sidewall engages the ramped proximal portion of the deflecting arm of the crossbar adapter to flex the deflecting arm of the crossbar adapter towards the flexed position as the housing is received in the mounting area, and further wherein the deflecting arm of the crossbar adapter is configured to resiliently snap towards the at-rest position from the flexed position when the outwardly extending barb of the upper sidewall of the housing clears the stepped snap feature of the deflecting arm to releasably couple the housing to the crossbar adapter.

2. The refrigerated appliance of claim 1, wherein the housing includes an inner cavity.

3. The refrigerated appliance of claim 2, wherein the user interface module includes an electronic touch film disposed within the inner cavity of the housing.

4. The refrigerated appliance of claim 3, wherein a gap is defined between the upper crossbar assembly and the electronic touch film.

5. The refrigerated appliance of claim 4, wherein the gap between the upper crossbar assembly and the electronic touch film spans a distance within a range of about 5 mm to about 8 mm.

6. The refrigerated appliance of claim 5, wherein the crossbar adapter is comprised of a polymeric material, and further wherein the upper crossbar assembly is comprised of a metal material.

7. The refrigerated appliance of claim 1, wherein the lower crossbar assembly includes a deflecting arm having a ramped proximal portion and an outwardly offset distal tab with a stepped snap feature disposed therebetween, and further wherein the deflecting arm of the lower crossbar assembly is operable between at-rest and flexed positions.

8. The refrigerated appliance of claim 7, wherein the outwardly extending barb of the lower sidewall engages the ramped proximal portion of the deflecting arm of the lower crossbar assembly to move the deflecting arm of the lower crossbar assembly from the at-rest position to the flexed position as the housing is received in the mounting area.

9. The refrigerated appliance of claim 8, wherein the deflecting arm of the lower crossbar assembly is configured to resiliently snap towards the at-rest position from the flexed position when the outwardly extending barb of the lower sidewall of the housing clears the stepped snap feature of the deflecting arm of the lower crossbar assembly to releasably couple the housing to the lower crossbar assembly.

10. A refrigerated appliance, comprising:
    a mounting area;
    a crossbar assembly disposed above the mounting area, the crossbar assembly having a hooked portion;
    a crossbar adapter having a hooked portion operably coupled to the hooked portion of the crossbar assembly, wherein the crossbar adapter further includes a downwardly extending deflecting arm operable between at-rest and flexed positions; and
    a housing having an upper sidewall with a ramped introductory portion and a stepped snap feature disposed thereon, wherein the deflecting arm moves towards the flexed position as the ramped introductory portion of the upper sidewall of the housing engages the deflecting arm of the crossbar adapter as the housing is received in the mounting area, and further wherein the deflecting arm of the crossbar adapter resiliently snaps towards the at-rest position from the flexed position when the stepped snap feature of the housing clears a stepped snap feature disposed on the deflecting arm of the crossbar adapter to releasably couple the housing to the crossbar adapter.

11. The refrigerated appliance of claim 10, wherein the crossbar assembly includes a length, and further wherein the crossbar adapter substantially spans the length of the crossbar assembly as coupled thereto.

12. The refrigerated appliance of claim 10, wherein the crossbar assembly includes a tab having a distal end, wherein the tab outwardly extends from the hooked portion of the crossbar assembly.

13. The refrigerated appliance of claim 12, wherein the crossbar adapter includes a swivel arm having a snap feature disposed one a distal end thereof, wherein the swivel arm outwardly extends from the hooked portion of the crossbar adapter.

14. The refrigerated appliance of claim 13, wherein the snap feature of the crossbar adapter is releasably coupled to the distal end of the tab of the crossbar assembly.

* * * * *